United States Patent
Layton (10) Patent No.: US 6,946,828 B1
(45) Date of Patent: Sep. 20, 2005

(54) BI-DIRECTIONAL CURRENT MEASUREMENT CIRCUIT THAT USES A TRANSCONDUCTANCE AMPLIFIER TO GENERATE A COPY CURRENT

(75) Inventor: Kent D. Layton, Lehi, UT (US)

(73) Assignee: AMI Semiconductor, Inc., Pocatello, ID (US)

( * ) Notice: Subject to any disclaimer, the term of this patent is extended or adjusted under 35 U.S.C. 154(b) by 144 days.

(21) Appl. No.: 10/442,618

(22) Filed: May 20, 2003

(51) Int. Cl.[7] .............................................. G01R 33/00
(52) U.S. Cl. ................................................. 324/117 R
(58) Field of Search ................................ 324/763–765, 324/117 R–127, 73.1, 158.1; 330/250–260; 327/65, 560, 563; 326/22

(56) References Cited

U.S. PATENT DOCUMENTS 4,697,152 A * 9/1987 Westwick ....................... 330/9
5,049,831 A * 9/1991 Westwick ................... 330/107
5,614,864 A * 3/1997 Stubbe et al. ................. 330/69

* cited by examiner

Primary Examiner—Vinh P. Nguyen
(74) Attorney, Agent, or Firm—Workman Nydegger (57) ABSTRACT

A current measurement circuit that measures current passing through two loads. The circuit includes a differential output transconductance amplifier. One current output terminal pf the amplifier receives the current from the first load with the first voltage input terminal coupled to that current output terminal. The second current output terminal provides a current to the second load with the second voltage input terminal coupled to the second current output terminal with the current provided at the second output terminal being approximately equal to the current received at the first current output terminal. The transconductance amplifier provides a copy current on the third current output terminal this is approximately equal to at least one of the other output currents. That copy current is then directly measured, rather than the actual current passing through the loads.

21 Claims, 4 Drawing Sheets

BI-DIRECTIONAL CURRENT MEASUREMENT CIRCUIT THAT USES A TRANSCONDUCTANCE AMPLIFIER TO GENERATE A COPY CURRENT

BACKGROUND OF THE INVENTION

1. The Field of the Invention

The present invention relates to analog circuits, and more specifically to current measuring circuits and transconductance amplifiers that enable current measurement.

2. Background and Related Art

Analog circuits have revolutionized the way people work and play and have contributed enormously to the advancement of humankind. Analog circuits may perform quite complex functions by uniquely combining smaller analog circuits that perform more fundamental functions. One common analog element is a current measurement circuit that measures the current at a node in a circuit or passing through a particular load. The current measurement circuit may be on-chip with the load whose current it is measuring, or may be separate and apart from the load.

There are many conventional current measurement circuits. A large portion of such current measurement circuits (including many current meters) use a resistor in series with the load. Such conventional current measurement circuits calculate the current flow by measuring the voltage drop across the series combination of the load and the resistor.

Figure 6:
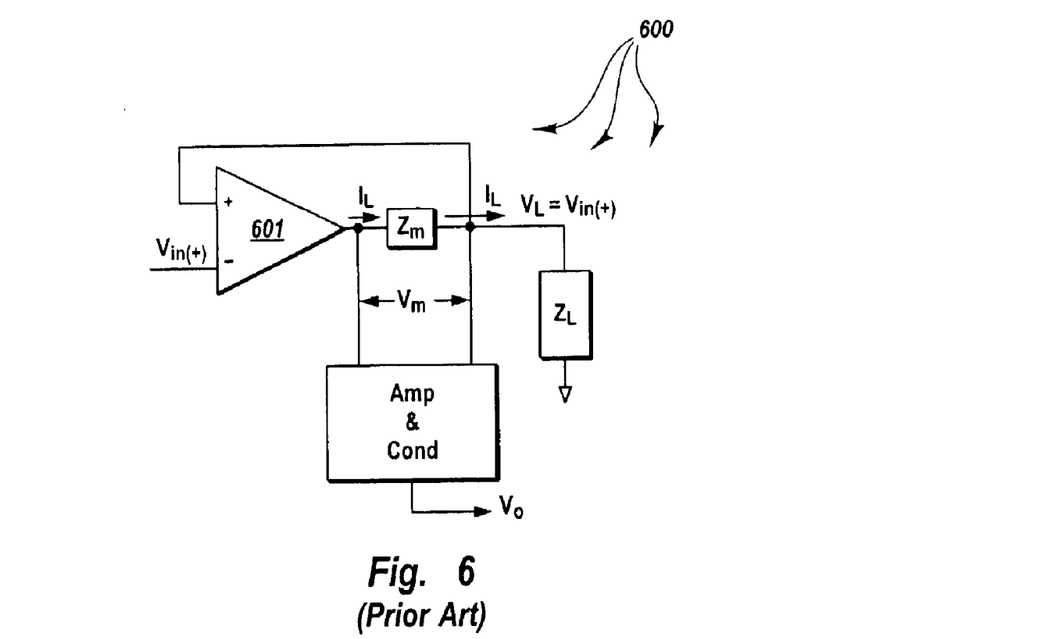
FIG. 6 illustrates a conventional current measurement circuit that at least partially compensates for series resistance.

FIG. 6 illustrates one conventional improvement to this current measurement circuit in the form of circuit 600. The circuit 600 improves measurement accuracy by compensating for the inclusion of the series resistance in measurement accuracy. However, the circuit operates with best accuracy when the load is driven by a low impedance node. The circuit will not operate accurately when the input node Vin is a high impedance node. Furthermore, the circuit 600 also limits the voltage headroom of the amplifier 601 as the load voltage $V_L$ approaches the level of voltage supply. Such loss in headroom is disadvantageous because it limits the voltage range $V_L$ over which the current can be measured.

Figure 7:
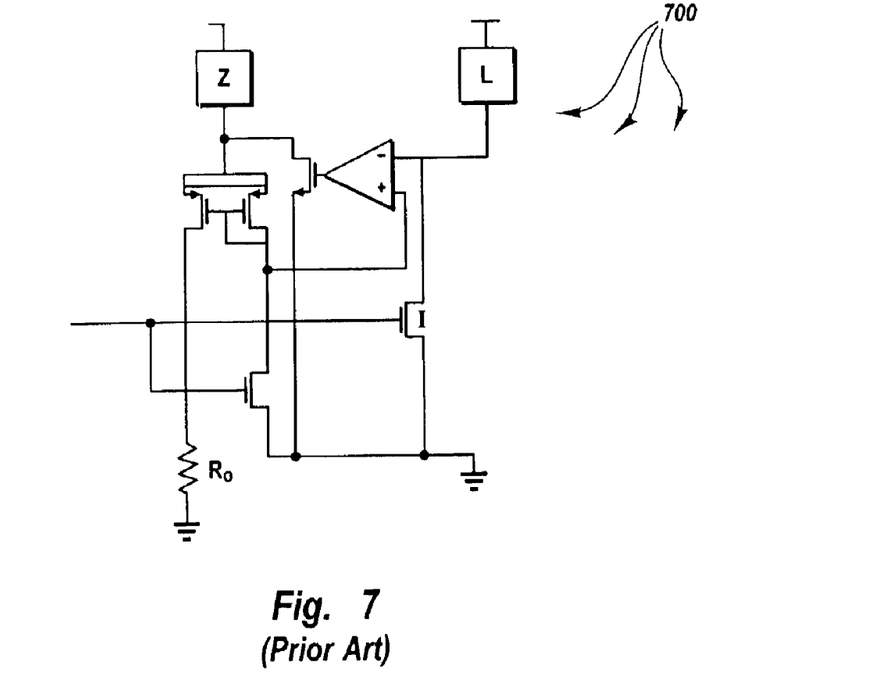
FIG. 7 illustrates a conventional current measurement circuit in accordance with another aspect of the prior art.

Other conventional current measurement circuits copy the current through a current carrying transistor as shown in the current measurement circuit 700 of FIG. 7. The circuit 700 allows current to flow in only one direction. However, many load circuits may be designed to allow current flow bi-directionally. In order to properly evaluate such loads, it would be advantageous to measure current flowing bi-directionally.

Accordingly, what would be advantageous is a current measurement circuit that works with high impedance nodes, does not result in a loss of amplifier headroom, works for bi-directional current, and reduces load voltage variations due to load current.

BRIEF SUMMARY OF THE INVENTION

The foregoing problems with the prior state of the art are overcome by the principles of the present invention which are directed towards a current measurement circuit that measures current passing through two loads. The circuit includes a differential output transconductance amplifier. One current output terminal of the amplifier receives the current from the first load with the first voltage input terminal coupled to that current output terminal. The second current output terminal provides a current to the second load with the second voltage input terminal coupled to the second current output terminal with the current provided at the second output terminal being approximately equal to the current received at the first current output terminal. The transconductance amplifier provides a copy current on the third current output terminal this is approximately equal to at least one of the other output currents.

The current measurement circuit is inserted between two loads in series without significantly affecting the actual current being measured. This is accomplished by generating a copy current, and then measuring the magnitude of the copy current. The transconductance amplifier has high output impedance thereby minimizing error between the copy current and the measured current. The current measurement circuit may be implemented using standard CMOS process and thus may be fabricated on an integrated circuit without process variations. Furthermore, the current measurement circuit may optionally be implemented on the same chip as the loads if the loads are also capable of being manufactured using CMOS technology.

Additional features and advantages of the invention will be set forth in the description that follows, and in part will be obvious from the description, or may be learned by the practice of the invention. The features and advantages of the invention may be realized and obtained by means of the instruments and combinations particularly pointed out in the appended claims. These and other features of the present invention will become more fully apparent from the following description and appended claims, or may be learned by the practice of the invention as set forth hereinafter.

BRIEF DESCRIPTION OF THE DRAWINGS

In order to describe the manner in which the above-recited and other advantages and features of the invention can be obtained, a more particular description of the invention briefly described above will be rendered by reference to specific embodiments thereof which are illustrated in the appended drawings. Understanding that these drawings depict only typical embodiments of the invention and are not therefore to be considered to be limiting of its scope, the invention will be described and explained with additional specificity and detail through the use of the accompanying drawings in which.

DETAILED DESCRIPTION OF THE PREFERRED EMBODIMENTS

Figure 1:
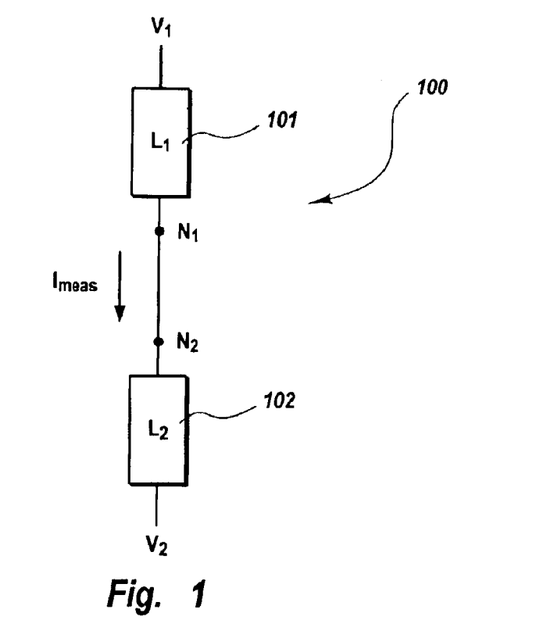
FIG. 1 illustrates a series of loads through which a current to be measured is passing.

FIG. 1 depicts a circuit 100 with current $I_{meas}$ flowing from an upper node (having voltage $V_1$) to a lower node (having voltage $V_2$) through load 101 (having impedance $L_1$) and through load 102 (having impedance $L_2$) and nodes $N_1$ and $N_2$. The aim is to accurately measure the current $I_{meas}$ passing through loads $L_1$ and $L_2$. The current $I_{meas}$ through the loads L1 and L2 may be expressed as in the following Equation 1:

$$I_{meas} = \frac{(V_1 - V_2)}{(L_1 + L_2)} \quad (1)$$

Figure 2:
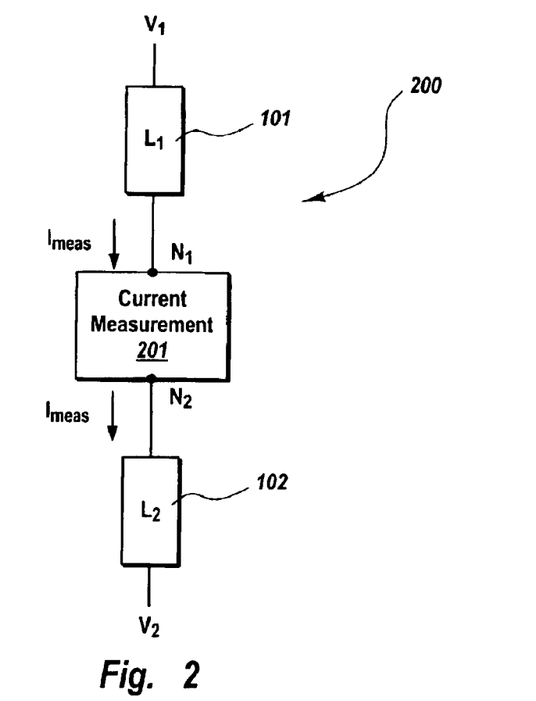
FIG. 2 illustrates a current measurement circuit interposed between the two series loads of FIG. 1.

FIG. 2 illustrates a circuit 200 that is the same as the circuit 100 of FIG. 1, except that a current measurement circuit 201 is interposed between nodes $N_1$ and $N_2$ to measure the value of $I_{meas}$. In order to preserve the equality represented by Equation 1, the difference between voltages at nodes $N_1$ and $N_2$ (hereinafter referred to as voltage $V_P$ and $V_N$, respectively) should be reduced to maximize current measurement accuracy.

Figure 3:
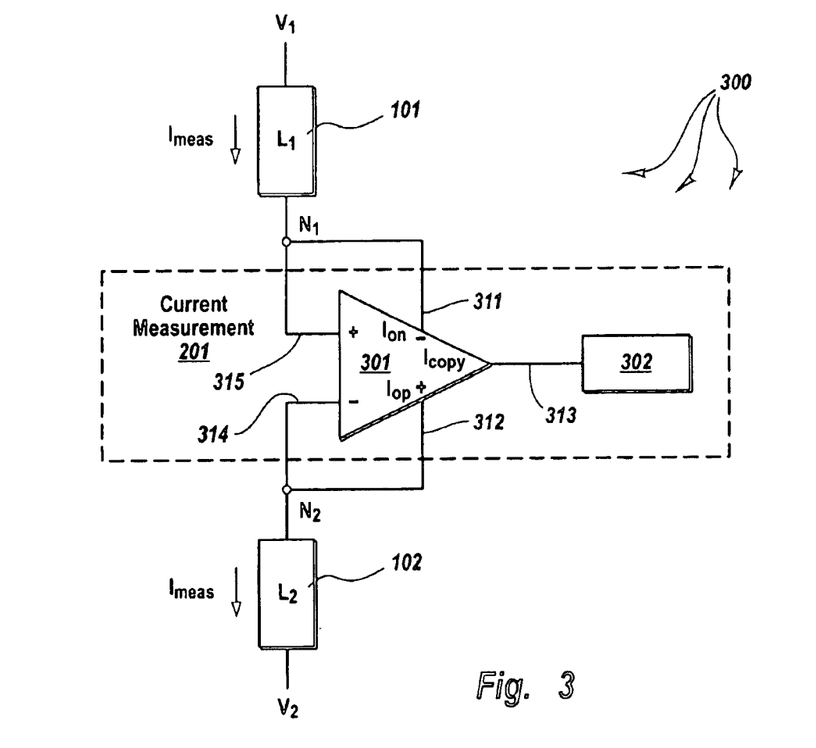
FIG. 3 illustrates a schematic diagram of the current measurement circuit in accordance with the present invention interposed between the two series loads.

FIG. 3 illustrates the circuit 201 in further detail in the context of loads 101 and 102. The circuit 201 includes a transconductance amplifier 301 that includes input terminals 314 and 315 that receive voltages $V_N$ and $V_P$, respectively. The transconductance amplifier 301 generates current outputs $I_{on}$, $I_{op}$ and $I_{copy}$ on output terminals 311, 312 and 313, respectively. Input terminals 314 and 315 draw negligible, if any, current. The transconductance amplifier 301 is configured such that a voltage differential between the input terminals 314 and 315 causes current $I_{on}$ to flow into the transconductance amplifier 301 at output terminal 311, and current $I_{op}$ of equal magnitude to flow out of terminal 312. The current $I_{copy}$ generated at terminal 313 is equal (or proportional) in magnitude to $I_{op}$ and $I_{on}$ and is designed to match the direction of either currents $I_{op}$ or $I_{on}$. The output currents, $I_{op}$, and $I_{on}$ and $I_{copy}$ can be expressed as follows in respective Equation 2, Equation 3, and Equation 4:

$$I_{op} = g_m(V_p - V_n) + \frac{V_{I312}}{Z_{o312}}, \quad (2)$$

$$-I_{on} = g_m(V_p - V_n) + \frac{V_{I311}}{Z_{o311}}, \quad (3)$$

$$I_{copy} = g_m(V_p - V_n) + \frac{V_{I313}}{Z_{o313}}, \quad (4)$$

where VI311, VI312 and VI313 are the voltages at corresponding output terminals 311, 312 and 313; and where Zo311, Zo312 and Zo313 are the output impedances at corresponding output terminals 311, 312 and 313.

The input terminal 315 is coupled to the output terminal 311 and to the node $N_1$. The input terminal 314 is coupled to the output terminal 312 and to the node $N_2$. In this feedback configuration the following Equation 5, Equation 6 and Equation 7 represent the currents in the circuit:

$$\frac{(V_1 - V_{N1})}{L_1} = -I_{on}, \quad (5)$$

$$-I_{op} = g_m(V_{N1} - V_{N2}) = I_{on}, \quad (6)$$

$$\frac{(V_{N2} - V_2)}{L_2} = I_{op}, \quad (7)$$

where $g_m$ is the transconductance of the transconductance amplifier 301.

For simplicity, the effects of output impedance have been removed from Equation 6. It will be shown later that this is a valid simplification. Rearranging Equations 5, 6 and 7 and solving for $I_{op}$ yields the following Equation 8:

$$I_{op} = \frac{(V_1 - V_2)}{\left(L_1 + L_2 + \frac{1}{g_m}\right)} \quad (8)$$

Equation 8 is identical to Equation 1 with the exception of the $1/g_m$ term in the denominator. As $1/g_m$ approaches zero, the current $I_{op}$ will accordingly approach the actual current to be measured $I_{meas}$. If $1/g_m$ approaches zero, then the transconductance $g_m$ approaches infinity and the voltage $V_{N1}$ converges towards voltage $V_{N2}$ as shown by Equation 6. As voltage $V_{N1}$ approaches voltage $V_{N2}$, the voltage $V_{I311}$ approaches $V_{I312}$, and the output impedance portions of Equation 2 and Equation 3 become equal and the simplification of (6) is therefore justified. This illustrates that the current $I_{op}$ can be set equal to $I_{meas}$ regardless of the impedances of loads L1 and L2 if the transconductance $g_m$ is sufficiently large.

As the current $I_{op}$ approaches the current to be measured $I_{meas}$, the current $I_{copy}$ will also approach $I_{meas}$ but will differ by an error current $I_{error}$ as defined by the following Equation 9:

$$I_{error} = I_{op} - I_{copy} = \frac{(V_{I312} - V_{I313})}{Z_o} \quad (9)$$

assuming that the output impedances $Z_{o312}$ and $Z_{o313}$ are equal to $Z_o$. In order to minimize the error current, the output impedance $Z_o$ should be large as apparent from Equation 9.

The output impedance of conventional transconductance amplifiers is inversely proportional to the bias current $I_{bias}$ of the output stage. This bias current also dictates the maximum output current $I_{max}$ of the amplifier. In other words, Equation 10 holds true as follows:

$$Z_0 \propto \frac{1}{I_{bias}} \propto \frac{1}{I_{max}} \quad (10)$$

If the bias current $I_{bias}$ or maximum output current $I_{max}$ is fixed, the output impedance $Z_o$ is also fixed as apparent from Equation 10. Equation 9 shows that the error current $I_{error}$ is proportional to $1/Z_o$ while Equation 10 indicates proportionality between the output impedance $Z_o$ and $1/I_{max}$. Together, Equation 9 and Equation 10 show that the error current $I_{error}$ is proportional to the maximum output current $I_{max}$.

In summary, the transconductance amplifier 301 yields an error current $I_{error}$ that is dependent on the maximum possible output current $I_{max}$. Accordingly, the error current due to output impedance will be proportionally large for currents that are much smaller than the maximum allowable current. Accordingly, error current $I_{error}$ may be reduced by implementing a variable bias current $I_{bias}$ which is derived from its output current $I_{out}$. This would allow the output impedance $Z_o$ to increase as the output current $I_{out}$ decreases thus maintaining an error current $I_{error}$ proportional to the output current $I_{out}$.

Once an accurate current copy $I_{copy}$ of the current to be measured $I_{meas}$ is made, the copied current $I_{copy}$ is connected to the input of circuit 302, which converts the current into a form that may be more readily measured. Circuit 302 may be any form of current measuring circuit since the measured current $I_{meas}$ is not dependent on the copied current $I_{copy}$. In one embodiment, the circuit is a series resistance to a reference voltage. The voltage potential across the resistor can be measured to determine the current.

The current measurement circuit 201 of FIG. 3 has a number of advantages over conventional current measurement circuits. In particular, the transconductance amplifier 301 generates and directly measures the copy current $I_{copy}$ rather than the measured current $I_{meas}$. Accordingly, the signal to be measured is kept in the current domain until the signal is decoupled from the circuit loads. Because of this, if the copy current $I_{copy}$ is measured using a series resistor as in the configurations described above for the conventional current meters, the voltage drop caused by the resistor for the copy current $I_{copy}$ will not likewise affect the original current $I_{meas}$. Therefore, the current measurement circuit 201 has reduced voltage headroom requirements and can operate closer to the supply rails. This is particularly useful with fully integrated circuits where the power supply is limited.

As apparent from Equation 8, the current measurement circuit 201 also eliminates the requirement for a low impedance node. Therefore, the current $I_{meas}$ may be measured regardless of the impedances L1 and L2 to either side of the current measurement circuit 201.

The current measurement circuit 201 also allows measurement of current that is either sourced or sunk (i.e., bi-directional) overcoming the limitations of current measurement architectures similar to the conventional current measurement circuit of FIG. 7.

Finally, since the current measurement circuit 201 maintains the voltages at nodes $N_1$ and $N_2$ at a substantially equal voltage, insertion of the current measurement circuit 201 does not affect the original current $I_{meas}$. The measurement circuit 201 may therefore be placed anywhere in a circuit, even with unknown impedances, and accurately measure current without significantly affecting the circuit.

Figure 4:
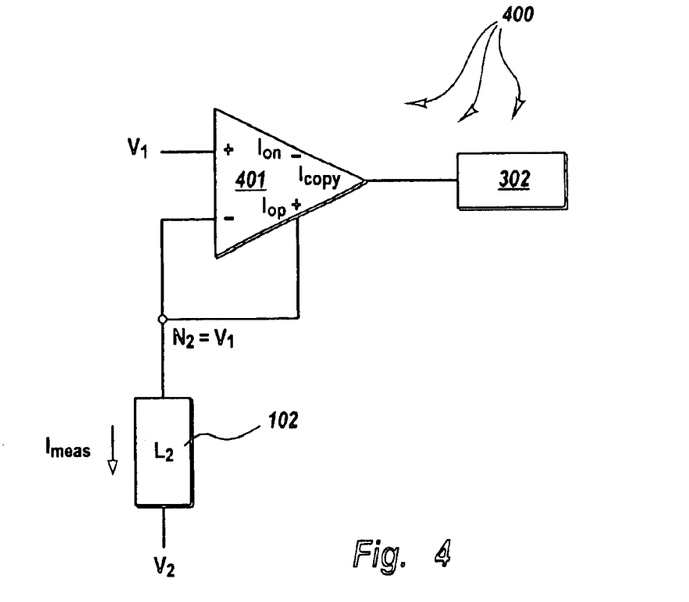
FIG. 4 illustrates a modified schematic diagram of the current measurement circuit that is enabled when one of the series loads is much smaller than the other.

The current measurement circuit 201 may be simplified if the magnitude of load $L_1$ is much greater than the magnitude of $L_2$ or vice versa. In this case, the feedback connection of the lower impedance node may be removed along with the associated output current node. In that case, the transconductance amplifier may be simplified. FIG. 4 illustrates how the current measurement circuit would be reduced in a case in which the magnitude of the load $L_1$ was much lower that the magnitude of the load $L_2$. The load $L_1$ is absent and the voltage input terminal 315 is decoupled from the current output terminal 311. As illustrated in FIG. 4, the voltage input terminal 315 and the current output terminal 311 may even be absent.

Figure 5:
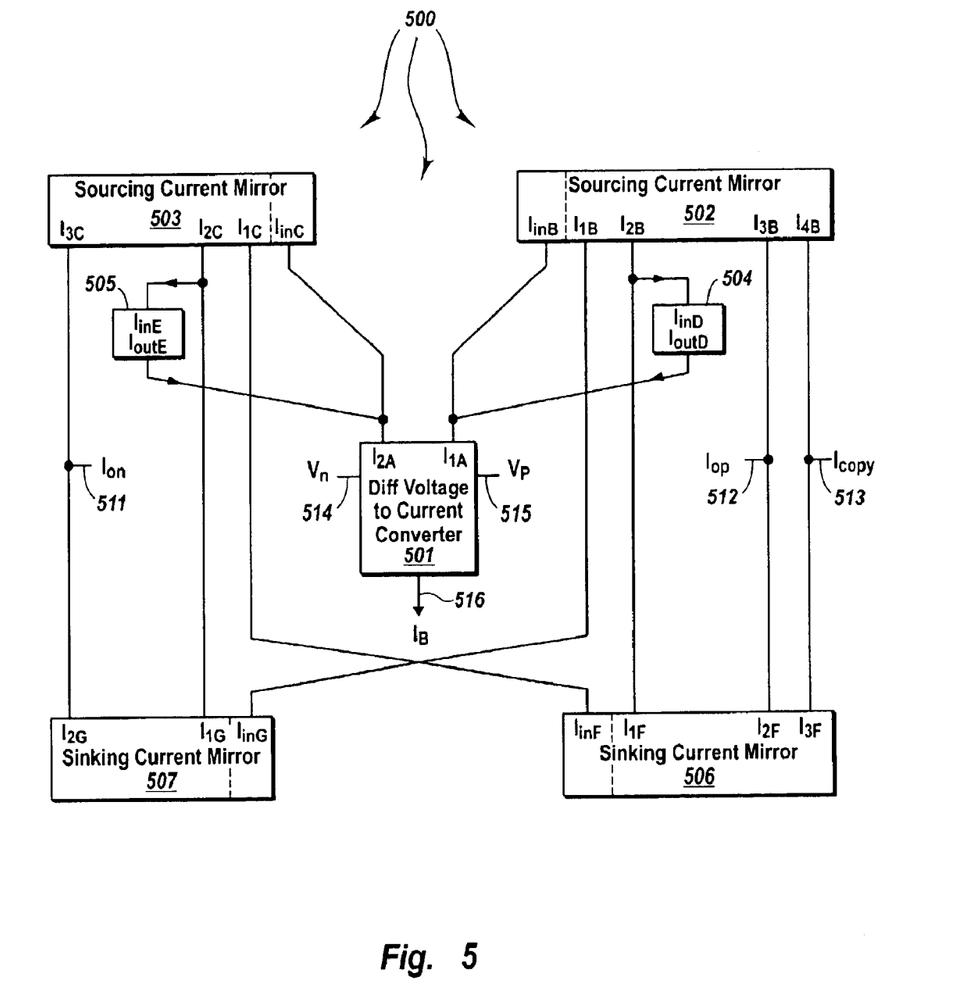
FIG. 5 illustrates a more detailed schematic diagram of a transconductance amplifier that may be used as the transconductance amplifier of FIGS. 3 and 4 in accordance with the present invention.

As apparent from Equation 9, the transconductance amplifier 301 should have a high tranconductance $g_m$ and an output impedance $Z_o$ proportional to the output current $I_{out}$. FIG. 5 shows a transconductance amplifier 500 that achieves this. The transconductance amplifier 500 includes a differential voltage to current converter 501, two sourcing current mirrors 502 and 503, two biasing circuits 504 and 505, and two sinking current mirrors 506 and 507. The transconductance amplifier 500 includes two voltage input terminals 514 and 515, and three current output terminals 511, 512 and 513.

The differential voltage to current converter circuit 501 has two voltage input terminals that are each coupled to a corresponding one of the transconductance voltage input terminals 514 and 515. The differential voltage to current converter circuit 501 also has two current output terminals I1A and I2A that are configured to draw two currents that when added are equal to a bias current provided on a bias terminal 516. The bias current may be adjusted as appropriate given the maximum output current of the transconductance amplifier as mentioned above.

The sourcing current mirror 503 has a current input terminal IinC, and first, second and third current output terminals (I1C, I2C and I3C). The current provided by the current input terminal IinC is provided to the one current output terminal I2A of the differential voltage to current converter circuit 501. The sourcing current mirror 503 generates a current on the first, second, and third current output terminals (I1C, I2C and I3C) that is approximately equal to (or proportionally to) the current drawn from the current input terminal IinC of the first sourcing current mirror.

The sourcing current mirror 502 has a current input terminal IinB, and first, second, third and fourth current output terminals (I1B, I2B, I3B and I4B). The current provided at the current input terminal IinB is provided to the other current output terminal I1A of the differential voltage to current converter circuit 501. The second sourcing current mirror 502 generates a current on the first, second, third and fourth current output terminals I1B, I2B, I3B and I4B) that is approximately equal to (or proportional to) the current drawn from the current input terminal IinB of the sourcing current mirror 502.

The sinking current mirror 507 has a current input terminal IinG, and first and second current output terminals (I1G and I2G). The current input terminal IinG is coupled to the current output terminal I1B of the second sourcing current mirror 502. The current output terminal I1G is coupled to the second current output terminal I2C of the sourcing current mirror 503. The current output terminal I2G is coupled to the third current output terminal I3C of the sourcing current mirror 503 and to the current output terminal 511 of the transconductance amplifier 500. The sinking current mirror 507 draws a current from the first and second current output terminals I1G and I2G that is approximately equal to (or proportional to) the current drawn at the current input terminal IinG.

The sinking current mirror 506 has a current input terminal IinF, and first, second and third current output terminals (I1F, I2F and I3F). The current input terminal IinF is coupled to the current output terminal I1C of the sourcing current mirror 503. The current output terminal I1F is coupled to the second current output terminal I2B of the sourcing current mirror 502. The current output terminal I2F is coupled to the third current output terminal I3B of the sourcing current mirror 502 and to the second current output terminal 512 of the transductance amplifier 500. The current output terminal I3F is coupled to the fourth current output terminal I4B of the sourcing current mirror 502 and to the third current output terminal 512 of the transconductance amplifier 500. The sinking current mirror 506 draws a current from the first, second and third current output terminals (I1F, I2F and I3F) that is approximately equal to (or proportional to) the current drawn at the current input terminal IinF.

The bias circuit 505 has an input terminal IinE coupled to the second current output terminal I2C of the sourcing current mirror 503, and has an output terminal IoutE coupled to a current output terminal I2A of the differential voltage to current converter circuit 501. The bias circuit 505 provides a current on the output terminal IoutE that is appropriately equal to (or proportional to) half the bias current $I_B$ minus the current received at the input terminal of the bias current.

The bias circuit 504 has an input terminal IinD coupled to the second current output terminal I2B of the sourcing current mirror 502, and has an output terminal IoutD coupled to a current output terminal I1A of the differential voltage to current converter circuit 501. The bias circuit 504 provides a current on the output terminal IoutD that is appropriately equal to (or proportional to) half the bias current $I_B$ minus the current received at the input terminal of the bias circuit.

For small input voltage differentials between voltage input terminals 514 and 515, the output current different between current output terminals I1A and I2A may be written as follows in Equation 11.

$$I_1 - I_2 = k(V_p - V_n) \tag{11}$$

where k is a gain constant, and $I_1$ and $I_2$ are the currents drawn at respective output terminals I1A and I2A of the differential voltage to current converter circuit 501, while the bias current $I_b$ sources current.

The currents through the system can be evaluated by analyzing the circuit with an iterative approach based on different input voltages. When the input voltages $V_n$ and $V_p$ applied at the differential voltage to current converter circuit 501 are equal, the currents $I_1$ and $I_2$ both equal $I_B/2$. In this example, we will assume that current mirror provide and draw currents that are approximately equal to the currents that are provided and drawn into its current input terminal.

Initially, assuming that the current out of the bias circuits 504 and 505, the current out of the input terminals IinB and IinC must equal $I_B/2$. This implies that the output currents provided at current output terminals of the sourcing current mirrors 502 and 503 are also equal to $I_B/2$ and the currents into the current output terminals of sinking current mirrors 506 and 507 are also equal to $I_B/2$. Since the outputs of current mirrors 502, 503, 506 and 507 are equal, the currents into the input terminals IinD and IinE of the bias circuits 504 and 505 are zero. The current outputs provided by bias circuits 504 and 505 are then $I_B/2$. This output is equal to the currents received at current output terminals I1A and I2A of the differential voltage to current converter circuit 501. The currents provided at the input terminals IinB and IinC are now forced to zero. The output currents of current mirrors 502, 503, 506 and 507 also become zero, and the input currents into bias circuits 504 and 505 are still zero. Accordingly, the transconductance amplifier is in equilibrium with zero bias current through the current output terminals of the transconductance amplifier 500. Thus, with no output current, the output impedance of $I_p$, $I_n$, and $I_{copy}$ will be at the theoretical limit of the devices in the circuit.

When a voltage differential is presented across the input terminals 514 and 515, a current difference is introduced between the current output terminals I1A and I2A. The current into I1A is now equal to $I_B/2$ plus deltaI, wherein deltaI is some variation from $I_B/2$. The current into I2A would be $I_B/2$ minus deltaI. Since the output currents of the bias circuits 504 and 505 try to pull $I_B/2$, the input current drawn from input terminal IinC is deltaI and the current drawn from input terminal IinB is zero. The output currents of sourcing current mirror 502 are all zero as are the output currents of sinking current mirror 506. The output currents of mirrors 503 and 507 are equal to deltaI. The input current to bias circuit 505 becomes $I_B/2$ minus deltaI. The output current of bias circuit 505 becomes $I_B/2$ minus deltaI, and the current into the sourcing current mirror 503 increases to two times deltaI. This increases the current into bias circuit 505 to two times deltaI which in turn increases the input to part C to three times deltaI. This positive feedback continues until the input voltages to the circuit are equalized. When the inputs are equalized, the positive feedback loop is stabilized and the output current is maintained at the value of $I_{in}$ that was reached entering bias circuit 505. Since the current through sourcing current mirrors 502 and 503 is still zero, the output impedance of the outputs is based on the current through a single sinking or sourcing device. The output impedance of the system is greatly increased compared to classical transconductance amplifiers by eliminating the bias current of the output devices and only sourcing or sinking the required output current.

The present invention may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes, which come within the meaning and range of equivalency of the claims, are to be embraced within their scope.

What is claimed and desired secured by United States Letters Patent is:

1. A current measurement circuit comprising a transconductance amplifier that comprises the following:
    a first current output terminal configured to receive a current from a first load when a first load is coupled to the transconductance amplifier;
    a first voltage input terminal;
    a second current output terminal configured to provide a current to a second load when a second load is coupled to the transconductance amplifier;
    a second voltage input terminal; and
    a third current output terminal, wherein the transconductance amplifier is configured to provide or receive a current on the third current output terminal that is approximately equal or proportional in magnitude to the current received on the first current output terminal or provided on the second current output terminal.

2. A current measurement circuit in accordance with claim 1, further comprising the following:
    the first load, wherein the first voltage input terminal is coupled to the first current output terminal.

3. A current measurement circuit in accordance with claim 2, further comprising the following:
    the second load, wherein the second voltage input terminal is coupled to the second current output terminal.

4. A current measurement circuit in accordance with claim 1, further comprising the following:
    the second load, wherein the second voltage input terminal is coupled to the second current output terminal.

5. A current measurement circuit in accordance with claim 1, further comprising the following:
    a circuit coupled to the third current output terminal and configured to measure the current on the third output terminal.

6. A current measurement circuit in accordance with claim 1, wherein the transconductance amplifier is configured to provide the current on the third current output terminal that is approximately equal or proportional in magnitude to the current received on the first current output terminal.

7. A current measurement circuit in accordance with claim 6, wherein the transconductance amplifier is configured to provide the current on the third current output terminal that is approximately equal or proportional in magnitude to the current provided on the second current output terminal.

8. A current measurement circuit in accordance with claim 1, wherein the transconductance amplifier is configured to provide the current on the third current output terminal that is approximately equal or proportional in magnitude to the current provided on the second current output terminal.

9. A current measurement circuit in accordance with claim 1, wherein the transconductance amplifier is configured to receive the current from the third current output terminal that is approximately equal or proportional in magnitude to the current received on the first current output terminal.

10. A current measurement circuit in accordance with claim 9, wherein the transconductance amplifier is configured to receive the current from the third current output terminal that is approximately equal or proportional in magnitude to the current provided on the second current output terminal.

11. A current measurement circuit in accordance with claim 1, wherein the transconductance amplifier is configured to receive the current from the third current output terminal that is approximately equal or proportional in magnitude to the current provided on the second current output terminal.

12. A current measurement circuit in accordance with claim 1, wherein the transconductance amplifier comprises the following:
- a differential voltage to current converter circuit having a first voltage input terminal that is coupled to the first voltage input terminal of the transconductance amplifier, having a second voltage input terminal that is coupled to the second voltage input terminal of the transconductance amplifier, having a first current output terminal that is configured to draw a first output current, and a second current output terminal that is configured to draw a second output current, wherein the sum of the first and second currents is equal to a bias current;
- a first sourcing current mirror having a current input terminal, and first, second and third current output terminals, wherein the current provided at the current input terminal is provided to the first current output terminal of the differential voltage to current converter circuit, the first sourcing current mirror configured to generate a current on the first, second, and third current output terminals that is approximately proportional to the current drawn from the current input terminal of the first sourcing current mirror;
- a second sourcing current mirror having a current input terminal, and first, second, third and fourth current output terminals, wherein the current provided at the current input terminal of the second sourcing current mirror is provided to the second current output terminal of the differential voltage to current converter circuit, the second sourcing current mirror configured to generate a current on the first, second, third and fourth current output terminals that is approximately proportional to the current drawn from the current input terminal of the first sourcing current mirror;
- a first sinking current mirror having a current input terminal, and first and second current output terminal, wherein the current input terminal of the first sinking current mirror is coupled to the first current output terminal of the second sourcing current mirror, the first current output terminal of the first sinking current mirror is coupled to the second current output terminal of the first sourcing current mirror, the second current output terminal of the first sinking current mirror is coupled to the third current output terminal of the first sourcing current mirror, the first sinking current mirror configured to draw a current from the first and second current output terminals of the first sinking current mirror that is approximately proportional to the current drawn at the current input terminal of the first sinking current mirror;
- a second sinking current mirror having a current input terminal, and first and second current output terminal, wherein the current input terminal of the second sinking current mirror is coupled to the first current output terminal of the first sourcing current mirror, the first current output terminal of the second sinking current mirror is coupled to the second current output terminal of the second sourcing current mirror, the second current output terminal of the second sinking current mirror is coupled to the third current output terminal of the second sourcing current mirror, the third current output terminal of the second sinking current mirror is coupled to the fourth current output terminal of the second sourcing current mirror, the second sinking current mirror configured to draw a current from the first, second and third current output terminals of the second sinking current mirror that is approximately proportional to the current drawn at the current input terminal of the first sinking current mirror;
- a first bias circuit having an input terminal coupled to the second current output terminal of the first sourcing current mirror, and having an output terminal coupled to the first current output terminal of the differential voltage to current converter circuit, the first bias circuit configured to provide a current on the output terminal of the first bias circuit that is appropriately equal to half the bias current minus the current received at the input terminal of the first bias circuit; and
- a second bias circuit having an input terminal coupled to the second current output terminal of the second sourcing current mirror, and having an output terminal coupled to the second current output terminal of the differential voltage to current converter circuit, the second bias circuit configured to provide a current on the output terminal of the second bias circuit that is appropriately equal to half the bias current minus the current received at the input terminal of the second bias circuit;
- wherein, the fourth current output terminal of the second sourcing current mirror is coupled to the third current output terminal of the transconductance amplifier, the third current output terminal of the second sourcing current mirror is coupled to one of the first or second current output terminals of the transconductance amplifier, and wherein the third current output terminal of the first sourcing current mirror is coupled to the other of the first or second current output terminals of the transconductance amplifier.

13. A current measurement circuit in accordance with claim 12, wherein the third current output terminal of the second sourcing current mirror is coupled to the first current output terminal of the transconductance amplifier, and wherein the third current output terminal of the first sourcing current mirror is coupled to the second current output terminal of the transconductance amplifier.

14. A current measurement circuit in accordance with claim 12, wherein the third current output terminal of the second sourcing current mirror is coupled to the second current output terminal of the transconductance amplifier, and wherein the third current output terminal of the first sourcing current mirror is coupled to the first current output terminal of the transconductance amplifier.

15. A current measurement circuit in accordance with claim 1, wherein the transconductance amplifier comprises the following:
- a differential voltage to current converter circuit having a first voltage input terminal that is coupled to the first voltage input terminal of the transconductance amplifier, having a second voltage input terminal that is coupled to the second voltage input terminal of the transconductance amplifier, having a first current output terminal that is configured to draw a first output current, and a second current output terminal that is configured to draw a second output current, wherein the sum of the first and second currents is equal to a bias current;

a first sourcing current mirror having a current input terminal, and first, second and third current output terminals, wherein the current provided at the current input terminal is provided to the first current output terminal of the differential voltage to current converter circuit, the first sourcing current mirror configured to generate a current on the first, second, and third current output terminals that is approximately equal to the current drawn from the current input terminal of the first sourcing current mirror;

a second sourcing current mirror having a current input terminal, and first, second, third and fourth current output terminals, wherein the current provided at the current input terminal of the second sourcing current mirror is provided to the second current output terminal of the differential voltage to current converter circuit, the second sourcing current mirror configured to generate a current on the first, second, third and fourth current output terminals that is approximately equal to the current drawn from the current input terminal of the first sourcing current mirror;

a first sinking current mirror having a current input terminal, and first and second current output terminal, wherein the current input terminal of the first sinking current mirror is coupled to the first current output terminal of the second sourcing current mirror, the first current output terminal of the first sinking current mirror is coupled to the second current output terminal of the first sourcing current mirror, the second current output terminal of the first sinking current mirror is coupled to the third current output terminal of the first sourcing current mirror, the first sinking current mirror configured to draw a current from the first and second current output terminals of the first sinking current mirror that is approximately equal to the current drawn at the current input terminal of the first sinking current mirror;

a second sinking current mirror having a current input terminal, and first and second current output terminal, wherein the current input terminal of the second sinking current mirror is coupled to the first current output terminal of the first sourcing current mirror, the first current output terminal of the second sinking current mirror is coupled to the second current output terminal of the second sourcing current mirror, the second current output terminal of the second sinking current mirror is coupled to the third current output terminal of the second sourcing current mirror, the third current output terminal of the second sinking current mirror is coupled to the fourth current output terminal of the second sourcing current mirror, the second sinking current mirror configured to draw a current from the first, second and third current output terminals of the second sinking current mirror that is approximately equal to the current drawn at the current input terminal of the first sinking current mirror;

a first bias circuit having an input terminal coupled to the second current output terminal of the first sourcing current mirror, and having an output terminal coupled to the first current output terminal of the differential voltage to current converter circuit, the first bias circuit configured to provide a current on the output terminal of the first bias circuit that is appropriately equal to half the bias current minus the current received at the input terminal of the first bias circuit; and a second bias circuit having an input terminal coupled to the second current output terminal of the second sourcing current mirror, and having an output terminal coupled to the second current output terminal of the differential voltage to current converter circuit, the second bias circuit configured to provide a current on the output terminal of the second bias circuit that is appropriately equal to half the bias current minus the current received at the input terminal of the second bias circuit;

wherein, the fourth current output terminal of the second sourcing current mirror is coupled to the third current output terminal of the transconductance amplifier, the third current output terminal of the second sourcing current mirror is coupled to one of the first or second current output terminals of the transconductance amplifier, and wherein the third current output terminal of the first sourcing current mirror is coupled to the other of the first or second current output terminals of the transconductance amplifier.

16. A transconductance amplifier comprising the following:

a first voltage input terminal;

a second voltage input terminal;

a first current input terminal;

a second current input terminal;

a differential voltage to current converter circuit having a first voltage input terminal that is coupled to the first voltage input terminal of the transconductance amplifier, having a second voltage input terminal that is coupled to the second voltage input terminal of the transconductance amplifier, having a first current output terminal that is configured to draw a first output current, and a second current output terminal that is configured to draw a second output current, wherein the sum of the first and second currents is equal to a bias current;

a first sourcing current mirror having a current input terminal, and first, second and third current output terminals, wherein the current provided at the current input terminal is provided to the first current output terminal of the differential voltage to current converter circuit, the first sourcing current mirror configured to generate a current on the first, second, and third current output terminals that is approximately proportional to the current drawn from the current input terminal of the first sourcing current mirror;

a second sourcing current mirror having a current input terminal, and first, second, third and fourth current output terminals, wherein the current provided at the current input terminal of the second sourcing current mirror is provided to the second current output terminal of the differential voltage to current converter circuit, the second sourcing current mirror configured to generate a current on the first, second, third and fourth current output terminals that is approximately proportional to the current drawn from the current input terminal of the first sourcing current mirror;

a first sinking current mirror having a current input terminal, and first and second current output terminal, wherein the current input terminal of the first sinking current mirror is coupled to the first current output terminal of the second sourcing current mirror, the first current output terminal of the first sinking current mirror is coupled to the second current output terminal of the first sourcing current mirror, the second current output terminal of the first sinking current mirror is coupled to the third current output terminal of the first sourcing current mirror, the first sinking current mirror configured to draw a current from the first and second current output terminals of the first sinking current mirror that is approximately proportional to the current drawn at the current input terminal of the first sinking current mirror;

a second sinking current mirror having a current input terminal, and first and second current output terminal, wherein the current input terminal of the second sinking current mirror is coupled to the first current output terminal of the first sourcing current mirror, the first current output terminal of the second sinking current mirror is coupled to the second current output terminal of the second sourcing current mirror, the second current output terminal of the second sinking current mirror is coupled to the third current output terminal of the second sourcing current mirror, the third current output terminal of the second sinking current mirror is coupled to the fourth current output terminal of the second sourcing current mirror, the second sinking current mirror configured to draw a current from the first, second and third current output terminals of the second sinking current mirror that is approximately proportional to the current drawn at the current input terminal of the first sinking current mirror;

a first bias circuit having an input terminal coupled to the second current output terminal of the first sourcing current mirror, and having an output terminal coupled to the first current output terminal of the differential voltage to current converter circuit, the first bias circuit configured to provide a current on the output terminal of the first bias circuit that is appropriately equal to half the bias current minus the current received at the input terminal of the first bias circuit; and a second bias circuit having an input terminal coupled to the second current output terminal of the second sourcing current mirror, and having an output terminal coupled to the second current output terminal of the differential voltage to current converter circuit, the second bias circuit configured to provide a current on the output terminal of the second bias circuit that is appropriately equal to half the bias current minus the current received at the input terminal of the second bias circuit;

wherein, the fourth current output terminal of the second sourcing current mirror is coupled to the third current output terminal of the transconductance amplifier, the third current output terminal of the second sourcing current mirror is coupled to one of the first or second current output terminals of the transconductance amplifier, and wherein the third current output terminal of the first sourcing current mirror is coupled to the other of the first or second current output terminals of the transconductance amplifier.

17. A current measurement circuit in accordance with claim 16, wherein the third current output terminal of the second sourcing current mirror is coupled to the first current output terminal of the transconductance amplifier, and wherein the third current output terminal of the first sourcing current mirror is coupled to the second current output terminal of the transconductance amplifier.

18. A current measurement circuit in accordance with claim 16, wherein the third current output terminal of the second sourcing current mirror is coupled to the second current output terminal of the transconductance amplifier, and wherein the third current output terminal of the first sourcing current mirror is coupled to the first current output terminal of the transconductance amplifier.

19. A transconductance amplifier comprising the following:

a first voltage input terminal;

a second voltage input terminal;

a first current input terminal;

a second current input terminal;

a differential voltage to current converter circuit having a first voltage input terminal that is coupled to the first voltage input terminal of the transconductance amplifier, having a second voltage input terminal that is coupled to the second voltage input terminal of the transconductance amplifier, having a first current output terminal that is configured to draw a first output current, and a second current output terminal that is configured to draw a second output current, wherein the sum of the first and second currents is equal to a bias current;

a first sourcing current mirror having a current input terminal, and first, second and third current output terminals, wherein the current provided at the current input terminal is provided to the first current output terminal of the differential voltage to current converter circuit, the first sourcing current mirror configured to generate a current on the first, second, and third current output terminals that is approximately equal to the current drawn from the current input terminal of the first sourcing current mirror;

a second sourcing current mirror having a current input terminal, and first, second, third and fourth current output terminals, wherein the current provided at the current input terminal of the second sourcing current mirror is provided to the second current output terminal of the differential voltage to current converter circuit, the second sourcing current mirror configured to generate a current on the first, second, third and fourth current output terminals that is approximately equal to the current drawn from the current input terminal of the first sourcing current mirror;

a first sinking current mirror having a current input terminal, and first and second current output terminal, wherein the current input terminal of the first sinking current mirror is coupled to the first current output terminal of the second sourcing current mirror, the first current output terminal of the first sinking current mirror is coupled to the second current output terminal of the first sourcing current mirror, the second current output terminal of the first sinking current mirror is coupled to the third current output terminal of the first sourcing current mirror, the first sinking current mirror configured to draw a current from the first and second current output terminals of the first sinking current mirror that is approximately equal to the current drawn at the current input terminal of the first sinking current mirror;

a second sinking current mirror having a current input terminal, and first and second current output terminal, wherein the current input terminal of the second sinking current mirror is coupled to the first current output terminal of the first sourcing current mirror, the first current output terminal of the second sinking current mirror is coupled to the second current output terminal of the second sourcing current mirror, the second current output terminal of the second sinking current mirror is coupled to the third current output terminal of the second sourcing current mirror, the third current output terminal of the second sinking current mirror is coupled to the fourth current output terminal of the second sourcing current mirror, the second sinking current mirror configured to draw a current from the first, second and third current output terminals of the second sinking current mirror that is approximately equal to the current drawn at the current input terminal of the first sinking current mirror;

a first bias circuit having an input terminal coupled to the second current output terminal of the first sourcing current mirror, and having an output terminal coupled to the first current output terminal of the differential voltage to current converter circuit, the first bias circuit configured to provide a current on the output terminal of the first bias circuit that is appropriately equal to half the bias current minus the current received at the input terminal of the first bias circuit; and a second bias circuit having an input terminal coupled to the second current output terminal of the second sourcing current mirror, and having an output terminal coupled to the second current output terminal of the differential voltage to current converter circuit, the second bias circuit configured to provide a current on the output terminal of the second bias circuit that is appropriately equal to half the bias current minus the current received at the input terminal of the second bias circuit;

wherein, the fourth current output terminal of the second sourcing current mirror is coupled to the third current output terminal of the transconductance amplifier, the third current output terminal of the second sourcing current mirror is coupled to one of the first or second current output terminals of the transconductance amplifier, and wherein the third current output terminal of the first sourcing current mirror is coupled to the other of the first or second current output terminals of the transconductance amplifier.

20. A current measurement circuit in accordance with claim 19, wherein the third current output terminal of the second sourcing current mirror is coupled to the first current output terminal of the transconductance amplifier, and wherein the third current output terminal of the first sourcing current mirror is coupled to the second current output terminal of the transconductance amplifier.

21. A current measurement circuit in accordance with claim 19, wherein the third current output terminal of the second sourcing current mirror is coupled to the second current output terminal of the transconductance amplifier, and wherein the third current output terminal of the first sourcing current mirror is coupled to the first current output terminal of the transconductance amplifier.

* * * * *